United States Patent
Jin et al.

(10) Patent No.: US 10,707,274 B2
(45) Date of Patent: Jul. 7, 2020

(54) DISPLAY PANEL AND MANUFACTURING METHOD THEREOF

(71) Applicant: Wuhan China Star Optoelectronics Semiconductor Display Technology Co., Ltd., Wuhan (CN)

(72) Inventors: Jiangjiang Jin, Wuhan (CN); Hsianglun Hsu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 15/577,772

(22) PCT Filed: Nov. 16, 2017

(86) PCT No.: PCT/CN2017/111266
§ 371 (c)(1),
(2) Date: Nov. 29, 2017

(87) PCT Pub. No.: WO2019/075814
PCT Pub. Date: Apr. 25, 2019

(65) Prior Publication Data
US 2019/0123111 A1    Apr. 25, 2019

(30) Foreign Application Priority Data
Oct. 20, 2017   (CN) .......................... 2017 1 0983112

(51) Int. Cl.
H01L 27/32    (2006.01)
H01L 51/52    (2006.01)

(52) U.S. Cl.
CPC ........ H01L 27/322 (2013.01); H01L 27/3211 (2013.01); H01L 51/5253 (2013.01); *H01L 51/5256* (2013.01); *H01L 51/5275* (2013.01)

(58) Field of Classification Search
CPC .............. H01L 27/322; H01L 27/3211; H01L 51/5253; H01L 51/5256; H01L 51/5275
(Continued)

(56) References Cited

U.S. PATENT DOCUMENTS

2004/0147200 A1    7/2004  Urabe et al.
2006/0170338 A1*   8/2006  Masuichi ............ H01L 27/3283
                                                    313/504
(Continued)

FOREIGN PATENT DOCUMENTS

CN    1426269    6/2003
CN    1612658    5/2005
(Continued)

*Primary Examiner* — Dzung Tran

(57) ABSTRACT

An organic light-emitting diode display is provided. The organic light-emitting diode display includes an organic light-emitting display layer having red light-emitting units, green light-emitting units, and blue light-emitting units; a first inorganic layer disposed on the organic light-emitting display layer; and a light filter layer including a plurality of light filter units to increase light extraction efficiency of the light filter layer. The light filter units include first light filter units, second light filter units, and third light filter units. The first light filter units are aligned with the red light-emitting units; the second light filter units are aligned with the green light-emitting units; and the third light filter units are aligned with the blue light-emitting units. Material of the light filter layer is ink.

18 Claims, 2 Drawing Sheets

(58) Field of Classification Search
USPC .......................................................... 257/40
See application file for complete search history.

(56) References Cited

U.S. PATENT DOCUMENTS

| | | |
|---|---|---|
| 2009/0091241 A1 | 4/2009 | Tsou et al. |
| 2012/0299031 A1* | 11/2012 | Shiratori ............. H01L 51/5265 |
| | | 257/89 |
| 2014/0191215 A1* | 7/2014 | Tojo .................... H01L 51/5284 |
| | | 257/40 |
| 2014/0254147 A1* | 9/2014 | Cho ......................... F21V 9/00 |
| | | 362/231 |
| 2016/0254483 A1* | 9/2016 | Wang ................... H01L 51/003 |
| | | 257/40 |
| 2016/0380238 A1* | 12/2016 | Ma ...................... H01L 51/5275 |
| | | 257/40 |
| 2017/0110518 A1 | 4/2017 | Lee et al. |
| 2018/0019238 A1* | 1/2018 | Kim .................... H01L 51/0002 |
| 2018/0138243 A1 | 5/2018 | Wang et al. |

FOREIGN PATENT DOCUMENTS

| | | |
|---|---|---|
| CN | 103943662 | 7/2014 |
| CN | 104701465 | 6/2015 |
| CN | 106409876 | 2/2017 |

* cited by examiner

DISPLAY PANEL AND MANUFACTURING METHOD THEREOF

RELATED APPLICATIONS

This application is a National Phase of PCT Patent Application No. PCT/CN2017/111266 having International filing date of Nov. 16, 2017, which claims the benefit of priority of Chinese Patent Application No. 201710983112.7 filed on Oct. 20, 2017. The contents of the above applications are all incorporated by reference as if fully set forth herein in their entirety.

FIELD AND BACKGROUND OF THE INVENTION

The present disclosure relates to the field of display technologies, and more particularly to an organic light-emitting diode displays.

Active matrix organic light-emitting devices (AMOLED) have advantages of high contrast ratios, fast response speeds, free of backlight sources, etc. Thus, they are widely used in products such as mobile phone screens, computer displays, full-color televisions, etc.

In order to achieve a full-color AMOLED, contrast ratio of the AMOLED must be increased. Parallel RGB AMOLEDs are employed to achieve existing full-color AMOLEDs. This type of display program requires use of a fine metal mask (FMM) in order to achieve full-color patterns. However, as they are limited by aperture ratio and width of the FMM grid, it is difficult to achieve a high-resolution AMOLED. Meanwhile, numerous manufacturing processes of FMMs are very sophisticated and lead to higher production costs.

Therefore, it is necessary to provide an organic light-emitting diode display to solve problems existing in the prior art.

SUMMARY OF INVENTION

The present disclosure aims to provide an organic light-emitting diode display that increases a contrast ratio and a light extraction efficiency of the organic light-emitting diode, and reduces power consumption.

In order to solve the above technical problems, the present disclosure provides an organic light-emitting diode display, comprising:
an active array layer;
an organic light-emitting display layer disposed on the active array layer, wherein the organic light-emitting display layer comprises red light-emitting units, green light-emitting units, and blue light-emitting units;
a first inorganic layer disposed on the organic light-emitting display layer;
a light filter layer disposed on the first inorganic layer, wherein the light filter layer comprises a plurality of light filter units configured to increase light extraction efficiency of the light filter layer; the light filter units comprise first light filter units, second light filter units, and third light filter units; the first light filter units are aligned with the red light-emitting units, the second light filter units are aligned with the green light-emitting units, and the third light filter units are aligned with the blue light-emitting units; the first light filter units are made of red ink, the second light filter units are made of green ink, and the third light filter units are made of blue ink;
a first organic layer disposed on the light filter layer; and
a second inorganic layer disposed on the first organic layer;
wherein the light filter units are spaced from each other, and each of the light filter units is hemispherical.

In an organic light-emitting diode display of the present disclosure, a radius of each of the light filter units ranges from 1 μm to 5 μm.

In an organic light-emitting diode display of the present disclosure, a contact angle between each of the light filter units and the corresponding first inorganic layer is greater than 50 degrees and less than 90 degrees.

In an organic light-emitting diode display of the present disclosure, the numbers of the first light filter units, the second light filter units, and the third light filter units are equal.

In an organic light-emitting diode display of the present disclosure, the organic light-emitting diode display further comprises a third inorganic layer, wherein the third inorganic layer is disposed between the light filter layer and the first organic layer.

In an organic light-emitting diode display of the present disclosure, the organic light-emitting diode display further comprises a second organic layer, wherein the second organic layer is disposed between the first inorganic layer and the light filter layer.

In an organic light-emitting diode display of the present disclosure, a thickness of the first inorganic layer ranges from 100 nm to 1000 nn.

In an organic light-emitting diode display of the present disclosure, a material of the first inorganic layer is selected from a group consisting of $SiN_x$, $SiO_2$, $Al_2O_3$, and $ZrO_2$.

Furthermore, the present disclosure provides an organic light-emitting diode display, comprising:
an active array layer;
an organic light-emitting display layer disposed on the active array layer, wherein the organic light-emitting display layer comprises red light-emitting units, green light-emitting units, and blue light-emitting units;
a first inorganic layer disposed on the organic light-emitting display layer;
a light filter layer disposed on the first inorganic layer, wherein the light filter layer comprises a plurality of light filter units configured to increase light extraction efficiency of the light filter layer, the light filter units comprise first light filter units, second light filter units, and third light filter units; the first light filter units are aligned with the red light-emitting units, the second light filter units are aligned with the green light-emitting units, and the third light filter units are aligned with the blue light-emitting units; the first light filter units are made of red ink, the second light filter units are made of green ink, and the third light filter units are made of blue ink;
a first organic layer disposed on the light filter layer; and
a second inorganic layer disposed on the first organic layer.

In an organic light-emitting diode display of the present disclosure, the light filter units are spaced from each other.

In an organic light-emitting diode display of the present disclosure, wherein each of the light filter units is hemispherical.

In an organic light-emitting diode display of the present disclosure, wherein a radius of each of the light filter units ranges from 1 μm to 5 μm.

In an organic light-emitting diode display of the present disclosure, wherein a contact angle between each of the light filter units and the corresponding first inorganic layer is greater than 50 degrees and less than 90 degrees.

In an organic light-emitting diode display of the present disclosure, wherein the numbers of the first light filter units, the second light filter units, and the third light filter units are equal.

In an organic light-emitting diode display of the present disclosure, the organic light-emitting diode display further comprises a third inorganic layer, wherein the third inorganic layer is disposed between the light filter layer and the first organic layer.

In an organic light-emitting diode display of the present disclosure, wherein the organic light-emitting diode display further comprises a second organic layer, wherein the second organic layer is disposed between the first inorganic layer and the light filter layer.

In an organic light-emitting diode display of the present disclosure, wherein a thickness of the first inorganic layer ranges from 100 nm to 1000 nn.

In an organic light-emitting diode display of the present disclosure, wherein a material of the first inorganic layer is selected from a group consisting of $SiN_x$, $SiO_2$, $Al_2O_3$, and $ZrO_2$.

The organic light-emitting diode display of the present disclosure is characterized by disposing light filter units, which are made of different materials, on the red, green, and blue light-emitting units respectively, so that the color spectrums other than the color which is similar to each of the light-emitting units are filtered via the light filter units in order to increase the contrast ratio of the display; and the light filter units can further increase the light extraction efficiency, so that the power consumption is reduced.

BRIEF DESCRIPTION OF THE SEVERAL VIEW OF THE DRAWINGS

DESCRIPTION OF SPECIFIC EMBODIMENTS OF THE INVENTION

In the following detailed description, reference is made to the accompanying figures, in which various examples are shown by way of illustration. In this regard, directional terminology mentioned in the present disclosure, such as "top", "bottom", "front", "back", "left", "right", "vertical", etc., is used with reference to the orientation of the figures being described. Therefore, the directional terminology is used for purposes of illustration and is not intended to limit the present invention. In the accompanying figures, units with similar structures are indicated by the same reference numbers.

Figure 1:
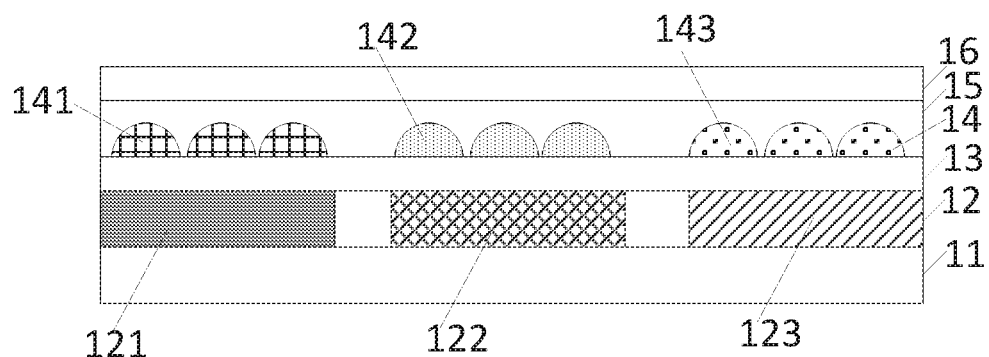
FIG. 1 is a schematic structural view of an organic light-emitting diode display according to an embodiment of the present disclosure.

Please refer to FIG. 1, where FIG. 1 is a schematic structural view of an organic light-emitting diode display according to an embodiment of the present disclosure.

As shown in FIG. 1, the organic light-emitting diode display of the embodiment comprises an active array layer 11, an organic light-emitting display layer 12, a first inorganic layer 13, a light filter layer 14, a first organic layer 15, and a second inorganic layer 16, wherein the active array layer 11 has a plurality of thin film transistors, the a plurality of thin film transistors comprise a gate electrode, a source electrode, and a drain electrode; the active array layer 11 may comprise an active layer configured to form a channel, a gate insulating layer, a first metal layer, an insulating interlayer layer, and a second metal layer.

The organic light-emitting display layer 12 is disposed on the active array layer 11, the organic light-emitting display layer 12 comprises red light-emitting units 121, green light-emitting units 122, and blue light-emitting units 123. It may further comprise light-emitting units in other colors.

The first inorganic layer 13 is disposed on the organic light-emitting display layer 12, and the first inorganic layer 13 is used for blocking outside water/oxygen, wherein the first inorganic layer 13 is deposited on the organic light-emitting display layer 12 by any one of chemical vapor deposition (CVD), atomic layer deposition (ALD), pulsed laser deposition (PLD), and sputtering methods.

Thickness of the first inorganic layer 13 ranges from 100-1000 nn. Because the thickness of the first inorganic layer 13 is within this range, external water/oxygen can be better blocked without increasing the thickness of the display.

Material of the first inorganic layer 13 is one of metallic or non-metallic nitrides, metallic or non-metallic oxides and metallic or non-metallic oxynitrides, such as one of $SiN_x$, $SiO_2$, $Al_2O_3$, and $ZrO_2$.

The light filter layer 14 is disposed on the first inorganic layer 13. The light filter layer 14 comprises a plurality of light filter units 141-143. The light filter units 141-143 are used for improving light extraction efficiency. The light filter units comprise first light filter units 141, second light filter units 142, and third light filter units 143, where the light filter units are spaced from each other. The light filter layer 14 is made of ink; the first light filter units 141 are made of red ink, the second light filter units 142 are made of green ink, and the third light filter units 143 are made of blue ink. Each of the light filter units 141-143 is at least one of the shapes consisting of spherical, hemispherical, super-hemispherical, and parabolic. Preferably, the shapes of all of the light filter units are same.

The first light filter units 141 are used for filtering color spectrums other than red to increase saturation of the red spectrum. The second light filter units 142 are used for filtering color spectrums other than green to increase the saturation of the green spectrum. The third light filter units 143 are used for filtering color spectrums other than blue to increase the saturation of the blue spectrum.

The first light filter units 141 are aligned with the red light-emitting units 121, the second light filter units 142 are aligned with the green light-emitting units 122, and the third light filter units 143 are aligned with the blue light-emitting units 123, wherein each of the red light-emitting units 121 correspond to a plurality of the first light filter units 141, each of the green light-emitting units 122 correspond to a plurality of the second light filter units 142, and each of the blue light-emitting units 123 correspond to a plurality of the third light filter units 143.

In an embodiment, each of the light filter units 141-143 are spherical, and a radius of each of the light filter units ranges from 1 µm to 5 µm. Because the radius is within this range, the light extraction efficiency can be better increased, and the effect of light filtering can be the greatest.

Figure 2:
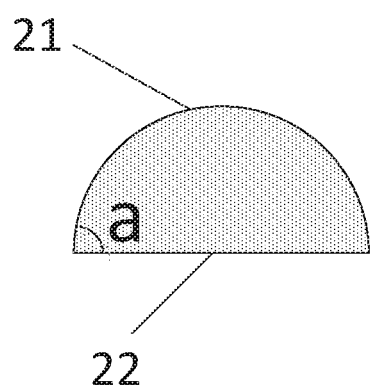
FIG. 2 is an enlarged schematic structural view of the light filter units of FIG. 1.

As shown in FIG. 2, one of the second light filter units 142 is used as an example, the second light filter units 142 comprise an arc-shaped top portion 21 and a flat bottom portion 22, and the angle between the arc-shaped top portion 21 and the bottom portion 22 is greater than 50 degrees and less than 90 degrees. That is, the contact angle between each of the second light filter units 142 and the corresponding first inorganic layer 13 is greater than 50 degrees and less than 90 degrees. Because the angle is within this range, the light extraction efficiency can be better increased. The remaining light filter units are the same as the second light filter units 142.

Specifically, during the manufacturing process, an ink-jet printing (IJP) process is employed to form spherical light filter units on R, G, and B light-emitting units by using different inks, respectively. The light filter units, which are located on the R, G, and B light-emitting units, act as R, G, and B light filters, respectively. The inks can be cured via UV curing or low-temperature heat curing.

In an embodiment, the numbers of spherical structures on R, G, and B are equal, that is, the numbers of the first light filter units 141, the second light filter units 142, and the third light filter units 143 are equal.

In another embodiment, the numbers of the first light filter units 141, the second light filter units 142, and the third light filter units 143 are not equal, and the number of the third light filter units 143 is greater than the number of the second light filter units 142, and the number of the second light filter units 142 is greater than that of the first light filter units 141, so that the contrast ratio of the display is better increased.

The first organic layer 15 disposed on the light filter layer 14, wherein the first organic layer 15 is formed by any one coating process of spin-coating, IJP, and slot-coating.

The thickness of the first organic layer 15 ranges from 1-20 μm. Because the thickness is within this range, external water/oxygen can be better blocked without increasing the thickness of the display.

The material of the first organic layer 15 is any one of polyimides, epoxy resins, and organic silicon materials.

The first organic layer 15 is used for protecting the light filter layer 14 and flattening the surface of the organic light-emitting diode display, the first organic layer 15 may further play a role of releasing stress.

The second inorganic layer 16 is disposed on the first organic layer 15. The material and the manufacturing process of the second inorganic layer 16 are similar to the first inorganic layer 13.

Figure 3:
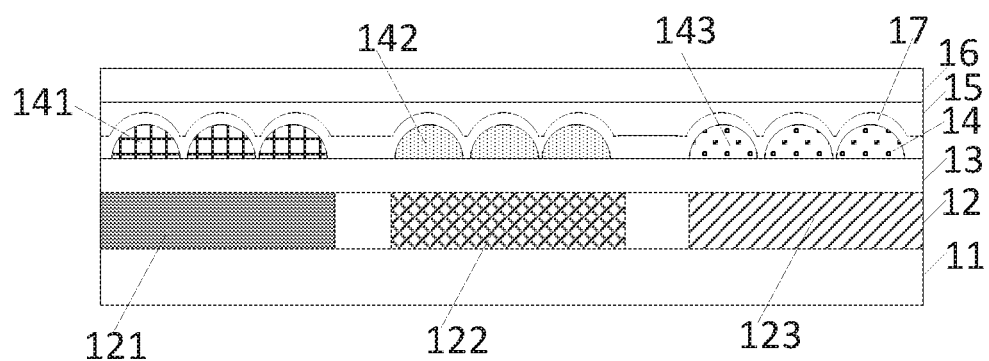
FIG. 3 is a schematic structural view of an organic light-emitting diode display according to another embodiment of the present disclosure.

Please refer to FIG. 3, where FIG. 3 is a schematic structural view of an organic light-emitting diode display according to another embodiment of the present disclosure.

The differences of the organic light-emitting diode display between this embodiment and the previous embodiment are the organic light-emitting diode display in this embodiment further comprises a third inorganic layer 17, wherein the third inorganic layer 17 is disposed between the light filter layer 15 and the first organic layer 15. The third inorganic layer 17 coordinates with the first organic layer 15 to better protect the light filter layer 14, and thus, further improving the contrast ratio and the light extraction efficiency of the display.

The material and the manufacturing process of the third inorganic layer 17 may be the same as the material and the manufacturing process of the first inorganic layer 13.

Figure 4:
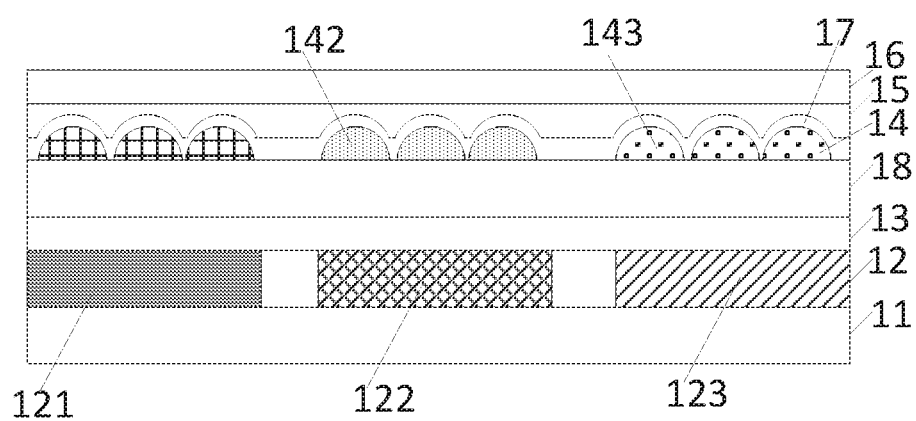
FIG. 4 is a schematic structural diagram of an organic light-emitting diode display according to another embodiment of the present disclosure.

Please refer to FIG. 4, where FIG. 4 is a schematic structural diagram of an organic light-emitting diode display according to another embodiment of the present disclosure.

The differences of the organic light-emitting diode display between this embodiment and the previous embodiment (FIG. 3) are: the organic light-emitting diode display of the embodiment further comprises a second organic layer 18, wherein the second organic layer 18 is disposed between the first inorganic layer 13 and the light filter layer 14. The function of the second organic layer 18 is the same as the function of the first organic layer 15.

The organic light-emitting diode display of the present disclosure is characterized by disposing light filter units, which are made of different materials, on the red, green, and blue light-emitting units respectively, so that the color spectrums other than the color which is similar to each of the light-emitting units are filtered via the light filter units in order to increase the contrast ratio of the display; and the light filter units can further to increase light extraction efficiency, so that the power consumption is reduced.

In summary, although the present disclosure has been described with preferred embodiments thereof, the above preferred embodiments are not used to limit the present disclosure. One ordinarily skilled in the art may carry out changes and modifications to the described embodiment without departing from the scope and the spirit of the present disclosure that is intended to be limited only by the appended claims.

What is claimed is:

1. An organic light-emitting diode display, comprising:
  an active array layer;
  an organic light-emitting display layer disposed on the active array layer, wherein the organic light-emitting display layer comprises red light-emitting units, green light-emitting units, and blue light-emitting units, and a top surface and a bottom surface of the red light-emitting units, the green light-emitting units, and the blue light-emitting units of the organic light-emitting display layer are both continuously connected and planar;
  a first inorganic layer disposed on the organic light-emitting display layer;
  a light filter layer disposed on the first inorganic layer, wherein the light filter layer comprises a plurality of light filter units configured to increase light extraction efficiency of the light filter layer, the light filter units comprise first light filter units, second light filter units, and third light filter units; the first light filter units are aligned with the red light-emitting units, the second light filter units are aligned with the green light-emitting units, and the third light filter units are aligned with the blue light-emitting units; the first light filter units are made of red ink, the second light filter units are made of green ink, and the third light filter units are made of blue ink, the light filter units are spaced from each other and each of the light filter units is hemispherical, and each of the light filter units is covered by an arc structure that is shaped to conform with the light filter units;
  a first organic layer disposed on the light filter layer; and
  a second inorganic layer disposed on the first organic layer.

2. The organic light-emitting diode display according to claim 1, wherein a radius of each of the light filter units ranges from 1 μm to 5 μm.

3. The organic light-emitting diode display according to claim 1, wherein a contact angle between each of the light filter units and the corresponding first inorganic layer is greater than 50 degrees and less than 90 degrees.

4. The organic light-emitting diode display according to claim 1, wherein number of the first light filter units, the second light filter units, and the third light filter units are equal.

5. The organic light-emitting diode display according to claim 1, wherein the organic light-emitting diode display further comprises a third inorganic layer, wherein the third inorganic layer is disposed between the light filter layer and the first organic layer.

6. The organic light-emitting diode display according to claim 1, wherein the organic light-emitting diode display further comprises a second organic layer, wherein the second organic layer is disposed between the first inorganic layer and the light filter layer.

7. The organic light-emitting diode display according to claim 6, wherein a thickness of the first inorganic layer ranges from 100 nm to 1000 nm.

8. The organic light-emitting diode display according to claim 1, wherein a material of the first inorganic layer is selected from a group consisting of $SiN_x$, $SiO_2$, $Al_2O_3$, and $ZrO_2$.

9. An organic light-emitting diode display, comprising:
   an active array layer;
   an organic light-emitting display layer disposed on the active array layer, wherein the organic light-emitting display layer comprises red light-emitting units, green light-emitting units, and blue light-emitting units, and a top surface and a bottom surface of the red light-emitting units, the green light-emitting units, and the blue light-emitting units of the organic light-emitting display layer are both continuously connected and planar;
   a first inorganic layer disposed on the organic light-emitting display layer;
   a light filter layer disposed on the first inorganic layer, wherein the light filter layer comprises a plurality of light filter units configured to increase light extraction efficiency of the light filter layer, the light filter units comprise first light filter units, second light filter units, and third light filter units; the first light filter units are aligned with the red light-emitting units, the second light filter units are aligned with the green light-emitting units, and the third light filter units are aligned with the blue light-emitting units; the first light filter units are made of red ink, the second light filter units are made of green ink, and the third light filter units are made of blue ink, the light filter units are spaced from each other and each of the light filter units is hemispherical, and each of the light filter units is covered by an arc structure that is shaped to conform with the light filter units;
   a first organic layer disposed on the light filter layer; and
   a second inorganic layer disposed on the first organic layer.

10. The organic light-emitting diode display according to claim 9, wherein a radius of each of the light filter units ranges from 1 µm to 5 µm.

11. The organic light-emitting diode display according to claim 9, wherein a contact angle between each of the light filter units and the corresponding first inorganic layer is greater than 50 degrees and less than 90 degrees.

12. The organic light-emitting diode display according to claim 9, wherein the numbers of the first light filter units, the second light filter units, and the third light filter units are equal.

13. The organic light-emitting diode display according to claim 9, the organic light-emitting diode display further comprises a third inorganic layer, wherein the third inorganic layer is disposed between the light filter layer and the first organic layer.

14. The organic light-emitting diode display according to claim 9, wherein the organic light-emitting diode display further comprises a second organic layer, wherein the second organic layer is disposed between the first inorganic layer and the light filter layer.

15. The organic light-emitting diode display according to claim 14, wherein a thickness of the first inorganic layer ranges from 100 nm to 1000 nm.

16. The organic light-emitting diode display according to claim 9, wherein a material of the first inorganic layer is selected from a group consisting of $SiN_x$, $SiO_2$, $Al_2O_3$, and $ZrO_2$.

17. The organic light-emitting diode display according to claim 1, wherein a material of the first organic layer is selected from the group consisting of polyimides, epoxy resins, and organic silicon materials.

18. The organic light-emitting diode display according to claim 9, wherein a material of the first organic layer is selected from the group consisting of polyimides, epoxy resins, and organic silicon materials.

\* \* \* \* \*